(12) United States Patent
Gmeiner et al.

(10) Patent No.: US 12,202,192 B2
(45) Date of Patent: Jan. 21, 2025

(54) SYSTEMS AND METHODS FOR LITHOGRAPHY-BASED ADDITIVE MANUFACTURING THREE-DIMENSIONAL (3D) STRUCTURES

(71) Applicant: CUBICURE GMBH, Vienna (AT)

(72) Inventors: Robert Gmeiner, Vienna (AT); Thomas Förster-Romswinckel, Pixendorf (AT); Philipp Neubauer, Fahrafeld (AT); Bernhard Busetti, Vienna (AT); Wolfgang Steiger, Vienna (AT); Raphael Krobath, Breitenfurt (AT)

(73) Assignee: CUBICURE GMBH, Vienna (AT)

( * ) Notice: Subject to any disclaimer, the term of this patent is extended or adjusted under 35 U.S.C. 154(b) by 178 days.

(21) Appl. No.: 17/787,878

(22) PCT Filed: Dec. 21, 2020

(86) PCT No.: PCT/IB2020/062286
§ 371 (c)(1),
(2) Date: Jun. 21, 2022

(87) PCT Pub. No.: WO2021/130654
PCT Pub. Date: Jul. 1, 2021

(65) Prior Publication Data
US 2023/0294354 A1    Sep. 21, 2023

(30) Foreign Application Priority Data

Dec. 23, 2019  (EP) .................................... 19020724

(51) Int. Cl.
*B29C 64/124* (2017.01)
*B29C 64/223* (2017.01)
(Continued)

(52) U.S. Cl.
CPC .......... *B29C 64/124* (2017.08); *B29C 64/223* (2017.08); *B29C 64/245* (2017.08);
(Continued)

(58) Field of Classification Search
CPC ................ B29C 64/124; B29C 64/321; B29C 64/223; B29C 64/245; B29C 64/295;
(Continued)

(56) References Cited

U.S. PATENT DOCUMENTS

| 2010/0227068 A1 | 9/2010 | Boot et al. |
| 2016/0144567 A1* | 5/2016 | Müller .................. B33Y 10/00 |
| | | 425/375 |
| 2017/0066185 A1 | 3/2017 | Ermoshkin et al. |

FOREIGN PATENT DOCUMENTS

| EP | 1719607 A1 | 11/2006 |
| EP | 3319543 B1 | 8/2019 |

(Continued)

OTHER PUBLICATIONS

International Search Report dated Apr. 1, 2021, issued in corresponding International Application No. PCT/IB2020/062286 (4 pgs.).

(Continued)

*Primary Examiner* — Mathieu D Vargot
(74) *Attorney, Agent, or Firm* — Pillsbury Winthrop Shaw Pittman, LLP

(57) ABSTRACT

A device for the lithography-based additive manufacturing of three-dimensional structures on a substrate, comprises a carrier element for carrying a substrate having a curved surface, a light engine designed for the dynamic patterning of light in an exposure field of said light engine, a material transport unit comprising a first drive means for transporting a material layer across the exposure field, second drive means for causing rotational movement of the substrate (Continued)

having the curved surface such as to establish a rolling contact of the curved surface on the material layer in a contact zone, said contact zone being arranged in the exposure field, and first control means configured to control said first and/or second drive means so that said rolling contact of the curved surface on the material layer is essentially slip-free.

31 Claims, 6 Drawing Sheets

(51) Int. Cl.
| | |
|---|---|
| *B29C 64/245* | (2017.01) |
| *B29C 64/277* | (2017.01) |
| *B29C 64/295* | (2017.01) |
| *B29C 64/321* | (2017.01) |
| *B29C 64/393* | (2017.01) |
| *B33Y 10/00* | (2015.01) |
| *B33Y 30/00* | (2015.01) |
| *B33Y 40/10* | (2020.01) |
| *B33Y 40/20* | (2020.01) |
| *B33Y 50/02* | (2015.01) |

(52) U.S. Cl.
CPC .......... *B29C 64/277* (2017.08); *B29C 64/295* (2017.08); *B29C 64/321* (2017.08); *B29C 64/393* (2017.08); *B33Y 10/00* (2014.12); *B33Y 30/00* (2014.12); *B33Y 40/10* (2020.01); *B33Y 40/20* (2020.01); *B33Y 50/02* (2014.12)

(58) Field of Classification Search
CPC ..... B29C 64/393; B29C 64/277; B33Y 10/00; B33Y 30/00; B33Y 50/02; B33Y 40/10; B33Y 40/20
See application file for complete search history.

(56) References Cited

FOREIGN PATENT DOCUMENTS

| | | |
|---|---|---|
| WO | 2019/213585 A1 | 11/2019 |
| WO | 2019/213588 A1 | 11/2019 |

OTHER PUBLICATIONS

Written Opinion of the International Searching Authority dated Apr. 1, 2021, issued in corresponding International Application No. PCT/IB2020/062286 (7 pgs.).

* cited by examiner

SYSTEMS AND METHODS FOR LITHOGRAPHY-BASED ADDITIVE MANUFACTURING THREE-DIMENSIONAL (3D) STRUCTURES

CROSS-REFERENCE TO RELATED APPLICATIONS

This application is the U.S. national stage entry of PCT/IB2020/062286, filed Dec. 21, 2020, which claims priority to European Patent Application No. 19020724.1, filed Dec. 23, 2019, the entire contents of both of which are herein incorporated by reference in their entireties.

TECHNICAL FIELD

The invention refers to systems and methods for lithography-based additive manufacturing three-dimensional (3D) structures on a substrate.

BACKGROUND

Many additive manufacturing (AM) processes for polymers deal with the challenge of combining high surface quality as well as small feature resolution with good thermomechanical material properties. Stereolithography (SLA) is a promising candidate for manufacturing items with features where a high degree of accuracy is desired. Some SLA processes use large photopolymer resin vats, in which a building platform and the layers of the structure already printed on the building platform are submerged during the printing process. In these systems, new layers are added on top of each other at the surface of the liquid resin. Different light sources are typically used in order to induce photopolymerization of the liquid photopolymer resin layer. As an example, Digital Light Processing (DLP), other active mask projection systems, and/or laser-scanner based systems may be used to selectively project light information on the surface of the photopolymer resin. These printing concept(s) advantageously allow use of large resin vats and often result in large building areas.

However, generating a thin layer of resin between a submerged structure and the free surface of the liquid resin bath is limited in accuracy (e.g. regarding the liquid layer thickness) due to a variety of factors, including the viscosity and/or surface tension phenomena of the resin formulation used. Further, feature accuracy is typically limited when large building areas are used-even if laser/scanner systems are used. Optical limitations of the scanner lens construction, timing limitations of the traditionally used pulse laser sources as well as large deviation angles of the scanning field result in accuracy limitations of the whole printing process and accuracy shifts between the center and the edge of the building area. Another very important issue is the need for significant amounts of photopolymer material before a printing job can be started (e.g. vat filling procedure). As photopolymer resins can become chemically unstable, resin storage and degradation as well as cleaning a large resin vat can become an economical problem and limits the process stability over time.

The concepts mentioned above are especially designed to print on flat surfaces or at least place printed parts in an optimal orientation above a flat building plane or building platform. Thus, these processes are especially limited in their performance when additive manufacturing or additive material placement shall occur on top of round objects or curved surfaces as these objects would need to be totally submerged in the resin bath and thus physical process boundaries in form of resin bath size and volume are quickly reached.

Some stereolithographic approaches use vat-based concepts, where a liquid resin is filled into a transparent material vat. According to these approaches, a layer of the liquid resin is irradiated by selective light information from below, e.g., through the bottom of the material vat, so that the printed components are generated upside-down, sticking to a so-called building platform. These systems present some advantages, such as the possibility of mechanically adjusting the resin layer height by lowering the building platform into the resin vat. By doing so, layers of resin with desired thicknesses (e.g., thin layers of resin) and/or products with features of desired resolutions have become possible. However, many such systems are limited in their maximum printing area. As the building platform is lowered into a resin bath, generating the desired layer thickness, residual resin has to be pressed out of a narrowing gap. As this process is characterized by a two-dimensional plate-to-plate press phenomenon, the pressure in the gap often rises in relation to (e.g., by the square of) the printing area. Further, in many instances, such a layer may have to be separated from the bottom of the material vat after photopolymerization. This process again can generate strong forces depending on the size of the printed area. The concept itself may be limited in the physical dimensions of the printed components.

According to U.S. Pat. Pub. No. US 2017/0066185 A1, a carrier film is used to transport a layer of liquid resin into a process zone, wherein the carrier film is transparent to the radiation that is used for polymerizing the resin layer. The radiation source that is used for irradiating the resin layer is moved along the length of the building platform as the layer of liquid material carried by the carrier film gradually gets into contact with the building platform. Thus, the contacting zone together with the exposure zone of the radiation source moves along the length of the building platform so that a large area can be printed by means of a relatively small, movable print head. Due to the print head being moved relative to the building platform, the system disclosed in US 2017/0066185 A1 involves the risk of positioning errors along the displacement path of the print head, resulting in respective structuring errors, as well as the risk of misalignments between superimposed layers. Further, such a dynamic system complicates the control of the exposure time so as to provide enough exposure for obtaining solidification of the photopolymer resin material.

This may be true when additionally considering the specific requirements posed by various photopolymers. A further challenge when printing photopolymers with improved thermomechanical properties is related to the relatively low reactivity of such resins. Most SLA resin formulations contain a large fraction of di- or multifunctional monomers or oligomers. The high content of reactive groups (e.g. double bonds in acrylate- or methacrylate groups) may lead to an early gel-point of the formulation. This means that even at a relatively low rate of double-bond-conversion (sometimes 15-30%), the liquid resin gels and becomes solid and strong enough so that a fresh layer can be recoated without undermining structural integrity of a prior layer (e.g., without destroying and/or deforming a previous layer). In such a case only a very short light pulse is needed (e.g. by scanning a laser beam over the surface) to provide exposure until the material cures beyond a specified amount (e.g., exposure for a sufficient amount of solidification). The remaining uncured double-bonds can be converted by a post-curing step, leading finally to a highly cross-linked polymer. Such highly cross-linked polymers may exhibit a high glass transition temperature (Tg), but may suffer from low toughness due to the covalent network and are therefore only of limited use for industrial and/or mass production applications.

In contrast, resins with lower amount of multi-functional monomers yield polymer networks with fewer cross-links, improving the toughness of the polymer, but decreasing the glass-transition temperature to lower temperatures. To obtain a high toughness as well as high glass transition temperature, photopolymer formulations with a low amount of multi-functional monomers in combination with monomers or oligomers with strong secondary bonds (e.g. hydrogen bonds, Van der Waals bonds) and large molecular weight can be used. The strong secondary bonds increase the glass-transition temperature and the stiffness of the final polymer network, and the oligomers with high molecular weight (long chains) increase the elongation at break and in further consequence the toughness of the material. Such a photopolymer network thus provides similar thermo-mechanical properties like thermoplastic materials that are currently processed by injection molding and used in a large variety of engineering applications.

The challenge for processing such lowly cross-linked photopolymer networks with strong secondary bonds is twofold: The low content of reactive groups may lead to a delayed gel point, and the strong secondary bonds in combination with high molecular weight oligomers increase the viscosity of the formulation significantly, leading to formulations which cannot be processed with state-of-the art systems for lithography-based AM.

SUMMARY OF THE INVENTION

Therefore, it is an object of this invention to provide an improved device and method for the lithography-based additive manufacturing of three-dimensional (3D) structures that is suitable for processing lowly cross-linked photopolymer networks with strong secondary bonds. In particular, the device(s) and/or method(s) described herein shall enable the precise manufacturing of 3D-structures on rotational bodies and curved surfaces, the printing area/surface of which may be a multiple of the exposure field of the light engine. Further, the device(s) and/or methods described herein shall allow for precise control of exposure time(s) so as to provide enough exposure for obtaining solidification of the photopolymer resin material. For example, the exposure time shall provide exposure until the material cures beyond a specified amount (e.g., exposure for a sufficient amount of solidification). This could be exposure to bring the material to a solid state, exposure to cause the material to fully and/or partially cure beyond a threshold, etc.

It is a further object of the invention to provide a stable and continuous additive manufacturing process for photopolymer substances (unfilled and filled photopolymer resins), which at the same time provides high printing accuracy, a large process flexibility as regards the chemical composition of the photopolymer resin, high production stability, high autonomy and an overall process concept which is physically scalable without significantly changing the printing parameters. The targeted photopolymers should provide excellent thermo-mechanical properties, supporting a printing process which is capable of processing resins with low reactivity, low crosslink-density, a delayed gel-point and high viscosity.

In order to solve these and other objects, the invention provides a device for the lithography-based additive manufacturing of three-dimensional structures on a substrate, the device comprising:

a carrier element for carrying a substrate having a curved surface, a light engine designed for the dynamic patterning of light in an exposure field of said light engine, a material transport unit comprising first drive means for transporting a material layer across the exposure field, second drive means for causing rotational movement of the substrate having the curved surface such as to establish a rolling contact of the curved surface on the material layer in a contact zone, said contact zone being arranged in the exposure field, first control means configured to control said first and/or second drive means so that said rolling contact of the curved surface on the material layer is essentially slip-free.

The device allows the 3D-printing of a layer or of a plurality of superimposed layers on the curved surface of a substrate. In particular, the curved surface is a surface that has a uniaxial curvature. Preferably, the curved surface is a cylindrical surface. The term "curved surface" may refer to the original curved surface of the substrate or to the curved surface of a preceding layer that has been printed on the original surface of the substrate in case the invention is used to print a plurality of superimposed curved material layers.

The invention allows the 3D-printing of layers on a curved surface, wherein the printed layers follow the curvature of the curved surface so that a curved layer may be produced.

The unit that comprises the light engine and the material transport unit may be referred to as a print head.

The device of the invention is characterized by a relative movement of the light engine and the curved surface, so that structures can be printed on large curved surfaces, such as curved surfaces having a circumferential extension which is a multiple of the exposure field of the light engine, in particular at least three times the exposure field of the light engine. According to this disclosure, "relative movement" of two devices may mean that either or both of the two devices move relative to the other one. For instance, "relative movement" of the light engine and the curved surface may mean that the light engine and the curved surface are moved relative to each other. For example, if the light engine is stationary, the curved surface is driven to rotate relative to the building plane around a rotational axis. The rotational axis of the rotational movement of the curved surface extends coaxial or parallel to the axis of the uniaxial curvature of the curved surface.

As described herein, "light" may include any electromagnetic radiation that is able to induce polymerization of a photopolymer resin. The term "light" need not be restricted to visible light, e.g., the portion of the spectrum that can be perceived by the human eye.

A light engine may be designed to pattern light in an exposure field of the light engine to selectively cure a photopolymer resin in accordance with the pattern. In particular, this may involve dynamic patterning of light in an exposure field of the light engine. The patterning of light may be accomplished by a Digital Light Processor (DLP) or other active mask projection systems as well as laser-scanner based systems to selectively project light information on the surface of a photopolymer resin. The dynamic light engine is able to generate dynamic light information, such as dynamic projected images, laser scanning or other zero-dimensional, one-dimensional or two-dimensional dynamic light information.

Preferably, the invention provides for pattern data feeding means for feeding a sequence of pattern section data to the light engine at an adjustable feeding rate.

"Pattern data," as used herein, may include data provided to a light source (e.g., a light engine) that causes the light engine to selectively cure material on a building plane according to a specified pattern.

Because the exposure field of the light engine extends over a portion of the curved surface only, wherein the curing of the material layer is performed in the contact zone of the rolling contact of the curved surface on the material layer only, the light engine is provided with a sequence of sections of the entire pattern. The individual pattern sections received by the light engine from the pattern data feeding means are projected without delay so as to safeguard a precise control of the pattern to be printed. By controlling the feeding rate, at which the pattern sections are fed to the light engine, one controls the rate, at which the sequence of light pattern sections is emitted onto the material layer.

Feeding a sequence of pattern section data to the light engine comprises feeding control data or pattern data to the light engine, the control or pattern data being adapted to cause the light engine to emit a respective light pattern that is represented by said control or pattern data.

Preferably, the light engine is caused to emit the sequence of light pattern sections onto the material during the rolling contact of the curved surface on the material layer. In this way, a continuous process is achieved, in which the curved surface is continuously moved relative to the light engine by having the contact zone advance over the curved surface in a circumferential direction, while the sequence of pattern sections is projected at a specific rate.

In such a continuous process, it is often desirable for the dynamic patterning of light by the light engine to be synchronized with the rotational movement of the curved surface. Such synchronization shall result in that each pattern section is timing-wise and position-wise accurately placed relative to the curved surface and in that material layers are built exactly on top of each other in an aligned manner. Preferably, said synchronization is achieved by providing a rotational encoder for sensing a rotational position and/or a circumferential velocity of the curved surface relative to the light engine, wherein second control means are provided for adjusting the feeding rate of the pattern data feeding means based on the rotational position or the circumferential velocity sensed by the encoder. In this way, the dynamic light information is projected onto the photopolymer resin so that the dynamic speed (i.e. the rate at which the sequence of pattern sections is projected, e.g. the "scrolling speed" of the pattern) of this light information matches the physical speed of the rotational movement of the curved surface relative to the light engine as best as possible.

In order to perform appropriate synchronization over the entire displacement path, the encoder is configured for sensing a rotational position and/or a circumferential velocity of the curved surface relative to the light engine over the entire rotational path of the curved surface. Further, the rotational encoder is preferably configured for sensing a rotational position and/or a circumferential velocity in a continuous manner or at defined intervals. Accordingly, the second control means are preferably configured for adjusting the feeding rate continuously or at said defined intervals.

In order to ensure high precision, the encoder is able to detect the actual relative position or velocity between the light engine and the curved surface in an accurate way, preferably with an accuracy between 0.1 nanometers (nm) and 1.000 micrometers (μm). In various embodiments, the accuracy may be between 1 nm and 10 μm and the encoder may at the same time be able to measure and feed this position or velocity information with high repetition rate to the second control means. Preferably, the encoder is configured for detecting the relative position or velocity at a frequency of between 10 Hz and 100 MHz. In a preferred embodiment, such an encoder comprises an active encoder unit (logic unit), which may interpret discrete positioning signals and which is preferably mounted or coupled to the light engine, and a physical measurements band or encoder band which features the position signal information in a physical way (e.g., optical marks, electromagnetic marks, magnetic marks, etc.) and which is preferably mounted on the rotating carrier element that carries the substrate having the curved surface. The encoder preferably senses rotational position and/or circumferential velocity data in a non-contact manner, such as optically, electromagnetically or magnetically.

In order to provide real-time position or velocity data, the encoder is configured to feed its position and/or velocity data to the second control means with a maximum latency of 50 μs, preferably a maximum latency of 30 μs.

The second drive means may be controlled to ensure that the relative velocity between the light engine and the curved surface is as constant as possible to provide stable and uniform printing conditions. The ability of physically scaling the additive manufacturing process is benefiting from this requirement of velocity consistency. Adding mass to the moving part is helpful in facilitating control algorithms and drive engine selection to achieve constant velocity. However, achieving a constant velocity need not be a precondition for accurate additive manufacturing, since the feeding rate of the pattern data feeding means can be adjusted to changes in the circumferential velocity of the curved surface. Therefore, a sufficient dynamic light accuracy relative to the curved surface is also fully achieved during acceleration and deceleration phases in the relative movement between the light engine and the curved surface.

According to a preferred embodiment of the invention, the light engine is designed for intermittently emitting light to said exposure field at an adjustable light pulse rate, wherein the light engine is preferably configured to synchronize the light pulse rate to the feeding rate of the pattern data feeding means. By intermittently turning on and turning off the light engine so as to generate light pulses, the material layer is irradiated only over a section of the available time slot, i.e. the time slot defined by the feeding rate of the pattern data feeding means. In particular, the light pulses are synchronized with the feeding rate of the pattern data feeding means so that a light pulse is generated each time the light engine switches (e.g., "scrolls") to a new pattern section. Since the light pulses are emitted while the second drive means causes rotation of the curved surface relative to the light engine, the position of the patterned light emitted onto the material layer changes during the time slot, which has a blurring effect. By emitting the light only over a section of the available time slot, such effect may be minimized.

At the same time, it may be desirable for various photopolymers and/or advanced photopolymer resins to receive a threshold amount of radiation energy (e.g., beyond a minimum radiation energy) in order to induce polymerization. Non-limiting examples of photopolymers formulations that this may apply to include those described in WO 2019/

213585 A1, WO 2019/213588 A1 and EP 3319543 A1. The contents of these applications are hereby incorporated by reference as if set forth fully herein.

According to a preferred embodiment, the light engine is configured to adjust a pulse-duty factor of the light pulses. The pulse duty factor is the ratio of pulse duration to the pulse period. For example, a higher pulse-duty factor may be selected with a photopolymer material that requires a higher amount of radiation energy and a lower pulse-duty factor may be selected with a photopolymer material that requires a lesser amount of radiation energy.

A good compromise between these competing considerations may be achieved if the pulse-duty factor is set to a value between 0.1 and 0.8, preferably 0.2 and 0.7.

In connection with the pattern data feeding means, a preferred embodiment provides that the pattern data feeding means comprise a data storage that stores pattern data representative of a pattern of a material layer to be built on the curved surface, said pattern data being associated with a length dimension of said pattern measured in the circumferential direction of the rotation caused by the second drive means, wherein said pattern data comprises pattern section data representative of a plurality of pattern sections of said pattern along the length of said pattern.

Preferably, the pattern data is structured as a rectangular grid of pixels comprising a plurality of rows of pixels, wherein each pattern section comprises at least one row of pixels.

If the material layer is transported across the exposure field along a path that is tangential relative to the curved surface of the substrate, the contact zone between the material layer and the curved surface is a line extending parallel to the rotational axis of the rotational movement of the curved surface.

In order to cure the layer of the polymer resin in such a linear contact zone, each pattern section comprises for example one row of pixels, each row of pixels being projected onto the material layer one after the other with a frequency corresponding to the feeding rate of the pattern data feeding means. However, as a certain polymerization or curing threshold for various photopolymerizable substances might need to be addressed in the process, multi-row exposure patterns might be used.

If each pattern section comprises several rows of pixels, a preferred embodiment of the invention provides that said sequence of pattern section data fed to the light engine represents pattern sections that are offset from each other by one row of pixels. Therefore, the pattern sections sequentially arranged in the sequence of pattern sections overlap each other and the transition from one pattern section to the following pattern section is performed by adding a new row of pixels at the front end of the exposure field and removing a row of pixels at the trailing end of the exposure field, as the curved surface has been moved relative to the light engine by a circumferential distance that corresponds to the dimension of one row of pixels. In this way, the light engine scrolls through the pattern with a velocity that corresponds to the circumferential velocity of the curved surface relative to the light.

As mentioned earlier, a material transport unit is provided for transporting a material layer across the exposure field. According to a preferred embodiment, the material transport unit comprises a flexible carrier film that is at least partially transparent to the light emitted by the light engine, and wherein coating means (e.g., coating blades) are arranged for coating a front side of the flexible carrier film with the material layer, the front side of the carrier film facing the curved surface of the substrate when moving across the exposure field. The carrier film, in its section being moved across the exposure field, is preferably extending in a tangential direction with respect to the curved surface. The carrier film preferably is designed as an endless carrier film, a continuous carrier film, a carrier film that rotates using a belt or other drive mechanism that is coated at a location upstream of the exposure field. Preferably, a de-coating system may be provided downstream of the exposure field, which allows to remove eventual remainders of the photopolymer material from the carrier film before a new layer is applied. Preferably, a de-coating system comprises a scraper blade, which is pressed against a support plate with the moving carrier film being in between. In some embodiments, such a system collects the scraped material and delivers it back towards a storage area or storage tank.

In some embodiments, if the carrier film is not an endless film, the length thereof is adapted to the circumferential length of the curved surface or the carrier film is significantly longer than the circumferential length of the curved surface.

The material transport unit may comprise a carrier film tensioning mechanism (e.g., a mechanism that adds, removes, modifies, etc. tension to the carrier film), which is able to provide proper tensioning of the film. A sufficient tension of the carrier film is advantageous in order to obtain good resin coating and exposure results. In a preferred embodiment said tensioning mechanism is directly mounted to a roller that guides the carrier film.

Further, one or more rollers (e.g., an array of rollers) may be provided for guiding the carrier film during its duties in the said process. Preferably, such rollers are only arranged on one side of the carrier film, e.g. at the inside of an endless carrier film, to avoid direct contact with the material layer. However, the invention also encompasses embodiments, wherein rollers are mounted on the coated side of the carrier film, if necessary in an alternative embodiment of the device. In this case, the roller surface may be adapted for contacting the material layer, e.g., by selecting a specific roller surface or texture. Optionally such rollers may be individually heated in a controlled way.

According to the invention, first control means are provided to control said first and/or second drive means so that said rolling contact of the curved surface on the material layer is essentially slip-free.

The first drive means for transporting the material layer preferably comprises a drive engine, for example controlled by said first control means, for moving the carrier film in a controlled way so as to synchronize the carrier film velocity to the circumferential velocity of the curved surface induced by the second drive means. Such synchronization results in that there is no relative movement in the contact zone of the material layer and the curved surface during the rolling contact of the curved surface on the material layer.

In some embodiments, the first drive means may be coupled and/or directly mounted to one of the rollers of the carrier film system. For instance, more than one of the rollers are connected to the drive engine, wherein for example one driven roller may be near the coating zone and another driven roller may be the guiding roller.

Preferably, a guiding mechanism for guiding the carrier film is provided, such as a steerable guiding roller system, which is able to steer the carrier film in terms of drifting issues. Preferably, such a roller is directly connected to the carrier film motor drive. Optionally such a mechanism can be heated in a controlled way.

Preferably, a guiding plate is arranged in the exposure field between the light engine and the carrier film to define a gap between the carrier film and the curved surface and wherein the guiding plate is at least partially transparent to the light emitted by the light engine. The guiding plate is arranged such that the carrier film is in contacting relationship with the guiding plate when the carrier film moves across the exposure field, thereby guiding the carrier film. Thus, the guiding plate is contacting the back side of the flexible carrier film, the back side of the carrier film facing away of the curved surface of the substrate when moving across the exposure field. The guiding plate may comprise a planar or slightly rounded surface on its side facing the curved surface of the substrate so that a gap is formed between the planar or rounded surface of the guiding plate and the curved surface of the substrate. The width of the gap defines the material layer thickness that is exposed to the radiation of the light engine in the exposure field. If the guiding plate is planar, the guiding plate preferably extends in a tangential plane relative to the curved surface.

Optionally, the guiding plate is adjustable in a direction perpendicular to the curved surface in the contact zone, in order to adjust the width of the gap, if desired.

Considering the high viscosity of advanced photopolymer resins, the device of the invention may preferably comprise heating means for controlling the temperature of the material layer. In particular, the temperature of the material layer may be controlled in the exposure field, since the chemical reactivity of photosensitive polymers is directly influenced by their temperature. Controlling the temperature in the exposure field can be reached by heating the guiding plate which guides the carrier film in the exposure field. Accordingly, a preferred embodiment provides that first heating means are provided for heating the guiding plate. In particular, the heating means are arranged for heating the guiding plate in the exposure field.

Since the guiding plate is optically transparent to the wavelength or the wavelength range used for the resin curing, indirect heating means are preferred. Preferred heating means include hot air heating, such as heating means configured to heat the surrounding air or the process gasses, heating means configured to heat a transparent liquid that is pumped through the guiding plate or that surrounds the guiding plate on one side thereof, and heating means comprising heating elements for conductively heating the guiding plate in areas adjacent the exposure field. According to a preferred embodiment, the heating means comprise infrared heating elements, such as infrared radiators, to heat the guiding plate from the side that faces away from the curved surface of the substrate. In this way, the infrared radiation is hitting the guiding plate first before hitting the photosensitive material. In this connection, a preferred embodiment provides that the guiding plate is made of a material, which is opaque or only partially transparent to infrared radiation and transparent or at least partially transparent to the radiation wavelength that is used for curing the photopolymer resin.

Another process zone to be considered for being temperature controlled is the coating zone, where the carrier film is coated with the photopolymer resin. Heating the coating zone to a specific temperature can be advantageous in order to reduce the viscosity of the photopolymer resin, wherein the viscosity of the resin is determined by its temperature. To coat the carrier film with a thin layer of the photopolymer resin, the coating means comprise a rakel mechanism, such as a doctor blade that is arranged on the front side of the carrier film, the carrier film being supported in the coating zone by a support plate that is arranged on the back side of the carrier film opposite the rakel mechanism. Preferably, a heating element is provided for heating the rakel mechanism, such as the doctor blade. Further, a heating element may preferably also be provided for heating the support plate. When heated, the support plate transfers the heat to the carrier film, which in turn heats the photopolymer resin that is coated onto the carrier film in the coating zone.

Furthermore, a pre-heating and post-heating zone may be implemented around the exposure field to support the resin heating and in consequence to lower the resin viscosity before the resin is moved by the carrier film into the exposure field. The post-heating zone can help adjusting smooth temperature gradients and add additional process stability. In this connection, a preferred embodiment of the invention provides that second heating means are arranged between the coating means and the exposure field for heating the material layer.

Preferably, additional heating means are provided for controlling the temperature of the curved surface, since the resin temperature would drop significantly, if the resin were applied to a cold curved surface. This is of significance for the first layers printed onto the curved surface of the substrate due to the direct contact of such layer(s) with the surface of the substrate. Later in the printing process, heating of the curved surface is also preferable, since thermal expansion phenomena of the curved surface would negatively influence the printing accuracy over time, if the curved surface temperature or the temperature of the whole substrate were not controlled properly. The heating of the curved surface may be achieved by using heating pads or other heating elements to heat the carrier element of the substrate on which surface printing should occur or by means of heating the substrate itself by putting heating elements and temperature sensors on top or inside of such a substrate.

In this connection, according to a preferred embodiment of the invention, the substrate can be exchanged and is typically carried by a substrate carrier mechanism during printing operations. For instance, the substrate may be exchangeably arranged on or connected to the carrier element. This allows the substrate to be easily removed after the printing process has been concluded and a new substrate to be installed for the next printing process. Preferably, the process of removing and installing a substrate may be conducted automatically, such as by a coupling unit configured to couple the substrate and the carrier element to one another and/or means for fixing the substrate onto the carrier element that can be activated and released by an electrical signal. In an optional embodiment the substrate is exchangeably fixed to the carrier element by a vacuum device or by an electro-magnetic device. In particular, at least one channel is provided at the surface of the carrier element, which is connected to a vacuum source that is able to generate a negative pressure between the carrier element and the exchangeable substrate. In such an embodiment the exchangeable substrate may be, but is not limited to, a drum of sheet metal or a glass bottle. Furthermore, such a carrier element could also comprise automatic substrate exchange means, which is beneficial for autonomous printing procedures.

In a preferred embodiment the carrier element consists of a metal construction that has heating elements installed on it or inside it (e.g. to heat the substrate by contact heating).

According to a preferred embodiment of the invention the curved surface of the substrate and the material transport unit (in a preferred embodiment also including the print head) are configured for relative movement in a direction perpendicular to the curved surface. For this purpose, third drive means are preferably provided for causing relative movement of the transport unit and the curved surface along a displacement path extending perpendicular to the curved surface. By this height adjustment the width of the gap between the curved surface and the resin side of the carrier film can be adjusted in order to define the layer thickness of the material layer.

Further, the relative movability of the curved surface and the transport unit allows to adjust the system to print additional layers one over the other after a first layer has been printed onto the curved surface of the substrate. For each additional layer, the distance between the curved surface and the carrier film is increased step-wise by a dimension that corresponds to a layer thickness. Alternatively, a continuous and constant increase of the distance between the initial curved surface of the substrate and the carrier film is executed during the rotational movement of the curved surface. In a preferred embodiment and in the case of printing on a substrate initially having a cylindrical surface, the increase of said gap would be controlled to correspond to the thickness of one printing layer during a full revolution of said cylindrical surface. In this particular case, the relative movement between the light engine and the cylindrical surface would mathematically describe a spiral path around the cylindrical substrate.

Therefore, the curved surface and the print head may be movable relative to each other in at least two degrees of freedom, around a rotational axis extending parallel to or coaxial with the axis of the uniaxial curvature of the curved surface and along a displacement path extending perpendicular to the curved surface. In this connection, a preferred embodiment provides that the print head (including the light engine and the material transport unit) is movable in a direction extending perpendicular to the curved surface, while the substrate is fixed in said direction, and the substrate is rotatably moveable to establish rolling contact between the curved surface and the material layer, while the print head is rotationally fixed. An alternative embodiment provides that the print head is fixed in its position and the substrate is movable in at least one direction extending parallel and/or perpendicular to the curved surface and at the same time the substrate is rotatably moveable to establish rolling contact between the curved surface and the material layer. In said last configuration, the substrate could be moveable in one, two, three, four, five or more degrees of freedom to enable layer-wise printing on curved surfaces.

The device of the invention may show significant potential to combine the printing process with other manufacturing systems, in particular with non-lithographic additive manufacturing systems and/or with non-additive manufacturing systems. This may be due to the fact that during the lithographic additive manufacturing of parts or extensions of existing parts, every volume point inside of such parts or extensions is easily addressable for other mechanical, chemical or physical fabrication steps. According to a preferred embodiment, at least one secondary material structuring and/or material placing and/or material subtracting unit is arranged adjacent the print head, said material structuring and/or material placing and/or material subtracting unit preferably being guided for relative movement to the curved surface along a displacement path extending in a circumferential direction of the rotation caused by the second drive means and/or perpendicular thereto.

Examples of material structuring and/or material placing and/or material subtracting units include, but are not limited to, inkjet printing units, fused deposition modelling units, fiber placement or fiber coating units, drilling and boring units, soldering units, dye coating units, die bonding units, cold- and hot-plasma treatment units, such as plasma coating units, wire-bonding units, spray coating or micro-droplet units, casting units, such as a shell filling mechanism that is able to fill a printed shell with the same or another material, cutting units and multi-purpose pick-and-place units such as robotic arms or other physical object manipulators. Such process enhancement units could interact with the actual lithographic printing process in terms of being physically connected to the print head and thus using the same or an additional positioning control system, such as the rotational encoder, or they could move or could be placed individually along or around the curved surface by means of the same or different physical guiding systems as the print head or the curved surface. Some of the fabrication and manipulation systems mentioned above could also be mounted on robotic arms or other object manipulation systems that can move in lateral directions or in three-dimensional manner or in combined ways using mechanical joints and/or fixed or moving mounting points or joints.

According to another aspect the invention refers to a three-dimensional (3D) printer system. A 3D printer system may include a carrier element for a substrate, wherein the substrate comprises a curved building plane, building surface or building area. A material transport unit of the 3D printer system may include a carrier film. The carrier film may have one or more surfaces that receive and/or move photopolymer resins, as described herein. As noted herein, the carrier film may comprise a continuous/endless carrier system. The 3D printing system may include a nozzle or other device to eject photopolymer resin onto the carrier film. The nozzle/other device may create one or more material layer(s) of the photopolymer resin. In some embodiments, the nozzle/other device is configured to eject enough resin to create a single material layer of photopolymer resin on the carrier film.

A 3D printing system may include devices to maintain material layers of photopolymer resin at a specified thickness. As an example, a 3D printing system may include coating blades configured to maintain material layers that have been ejected from a nozzle onto a carrier film at a specified thickness. The coating blades may be adjustable in a direction orthogonal to the carrier film so that the thickness of material layers deposited on the carrier film can be adjusted. In some embodiments, a 3D printing system includes devices to mix material layers of photopolymer resin in a coating zone on the carrier film. Examples of such devices include scrapers, mixers, etc.

A 3D printing system may include material management units configured to perform structuring, placement, subtraction, or some combination thereof, to the one or more material layers. The material management units may include, e.g., robotic arms, sensors configured to sense the one or more material layers, etc.

The 3D printing system may include a light engine that is configured to provide light to cure the photopolymer resin. The light engine may include a light source and may include/be coupled to power sources that power the light source. An exposure field associated with the light engine may allow the light engine to expose light from the light engine to at least a part (possibly all) of the build plane. In some embodiments, the exposure field is associated with a window or other area that is substantially transparent to light from the light source. One or more sensors may sense attributes, such as position, velocity, acceleration, angular motion, etc. of a light engine relative to the building plane. The sensors may include linear or rotational encoders, calibrators, and/or other devices that sense attributes of the light engine relative to the building surface. In some embodiments, the sensors take optical measurements of the light engine.

In some embodiments, a 3D printing system includes a pattern data feeder configured to feed pattern section data to the light engine at a feeding rate in order to cure parts of material layers according to the pattern section data at a feeding rate (e.g., an adjustable feeding rate). The light engine may be configured to emit sequences of pattern sections at a feeding rate (e.g., an adjustable feeding rate) when the one or more of the light engine and the building surface move relative to each other along a displacement path or around a displacement axis. The pattern data feeder may receive instructions from one or more control units as discussed herein.

A 3D printing system may include one or more drive mechanisms that are configured to move the components of the 3D printing system relative to one another. A "drive mechanism," as used herein, may include a device configured to move an item and may include actuators, transducers, electrical components, etc. The drive mechanism(s) of a 3D printing system may be configured to transport material layers toward a build surface, an exposure field, and/or other areas of a 3D printing system. In some embodiments, the drive mechanism(s) include a first drive mechanism that moves the material transport unit, the light engine, and/or the build surface relative to one another. The first drive mechanism may be configured to transport one or more material layers (e.g., those that have been formed from photopolymer resin ejected from the nozzle) toward the exposure field of the light engine and/or parts of the build surface. In some embodiments, the first drive mechanism may be configured to rotate a conveyor or other structure on the carrier film toward the exposure field and/or build surface. The first drive mechanism may include rollers, such as tension rollers, adjustable rollers, and/or other devices configured to manage tension in the carrier film.

The drive mechanism(s) of a 3D printing system may be configured to move the light engine and/or the build surface relative to one another. In some implementations, the drive mechanism(s) include a second drive mechanism configured to move the light engine and/or the build surface so that the light engine moves relative to the build surface. Such relative movement may (but need not) be accomplished along the building plane defined by the build surface which in some embodiments can be in form of a curved or round surface or which can be a surface around a rotational axis.

A 3D printing system may include one or more control units. Any of the control units may include memory and, one or more processors, volatile and/or non-volatile storage, data inputs and/or outputs, etc. Any of the control units can receive sensor data from sensor(s) that sense attributes of other components, such as the light engine. The one or more processors may execute computer-program instructions stored on the memory and/or storage. In some implementations, the control unit(s) comprise a first control unit that is configured to instruct the drive mechanism(s) to optimize (e.g., reduce, minimize, etc.) movement of the material transport unit and the light engine relative to the build surface. The instructions may include instructions to the first drive mechanism to change position and/or velocity of the carrier film of the material transport unit. This could include slowing the material transport unit down or speeding it up. The instructions from the first control unit may also include instructions to the second drive mechanism to move the light engine and/or the build surface so that the material transport unit and the light engine are synchronized (e.g., in time and/or space) with one another. The control unit(s) may provide instructions to only one or to two or more of the material transport unit, the light engine, and the build surface. One or more of the control units may adjust feeding rates of pattern data feeders in response to a sensor signal.

A 3D printing system can include heating systems configured to heat material layers while the material layers are on at least part of a building plane or building surface within an exposure field associated with a light engine. The heating systems may be configured to decrease viscosity of the photopolymer resin so that the material layers can be 3D printed while on the building surface. Exposure to a light source may allow the material layers to be at least partially cured during the 3D printing process. Examples of heating systems include contactless heating lamps, infrared lamps, etc.

In some embodiments, a 3D printing system includes a pre-heating plate that is configured to maintain at least a portion of the material layers at a specified temperature before they are heated by, e.g., a heating system. The pre-heating plate may, but need not, be coupled to a part of the carrier film, such as a part of the carrier film that the material transport unit moves toward the building surface. A 3D printing system may include a post-heating plate configured to maintain material layers at a specified temperature after the material layers have been heated and/or printed on.

A 3D printing system may include a guiding plate that is at least partially transparent to a wavelength of light from the light source. The guiding plate may allow light from the light source to pass through it and through the exposure field to the building surface. In some embodiments, the guiding plate guides the carrier film to a specified position relative to the building surface. Such an arrangement may create a gap of a specified width between the carrier film and the building surface to allow a material layer that is to be 3D printed and/or cured between the guiding plate and the building surface. In an optional embodiment such a guiding plate features a curved or rounded surface facing the carrier film and the building surface.

According to another aspect, the invention provides a method as defined in claim 16 for the lithography-based additive manufacturing of three-dimensional structures on a substrate, the method comprising:
  ejecting a photopolymer resin onto a carrier film of a material transport unit to create at least one material layer of the photopolymer resin on the carrier film;
  driving the material transport unit to transport the material layer of the photopolymer resin across an exposure field configured to expose light from a light engine toward a curved surface of a substrate;
  causing the curved surface to rotate such as to establish a rolling contact of the curved surface on the material layer in a contact zone, while transporting the material layer across the exposure field,
  the light engine emitting light during said rolling contact of the curved surface on the material layer, thereby selectively curing the material layer in the contact zone.
Preferred embodiments of the method are defined in the dependent claims.

BRIEF DESCRIPTION OF THE DRAWINGS

In the following, the invention will be described in more detail by reference to specific preferred embodiments of the invention.

DETAILED DESCRIPTION

Figure 1C:
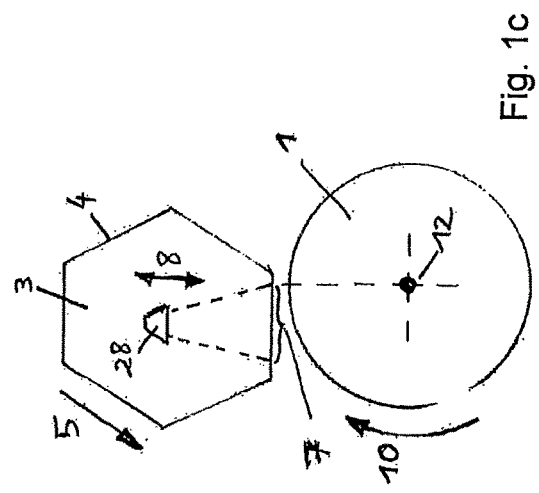
FIG. 1a-1c illustrates a first exemplary embodiment of a printing device of the invention.
Figure 1B:
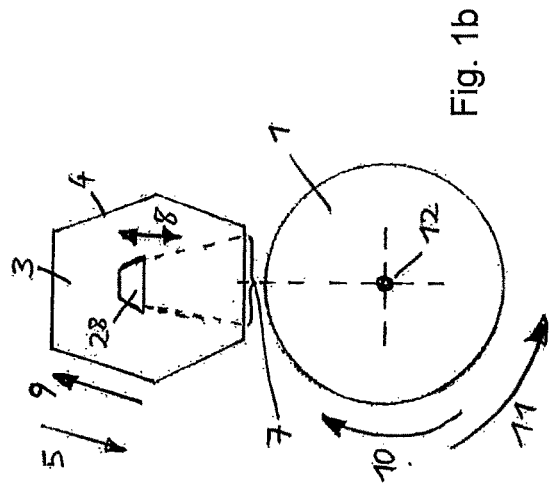
Figure 1A:
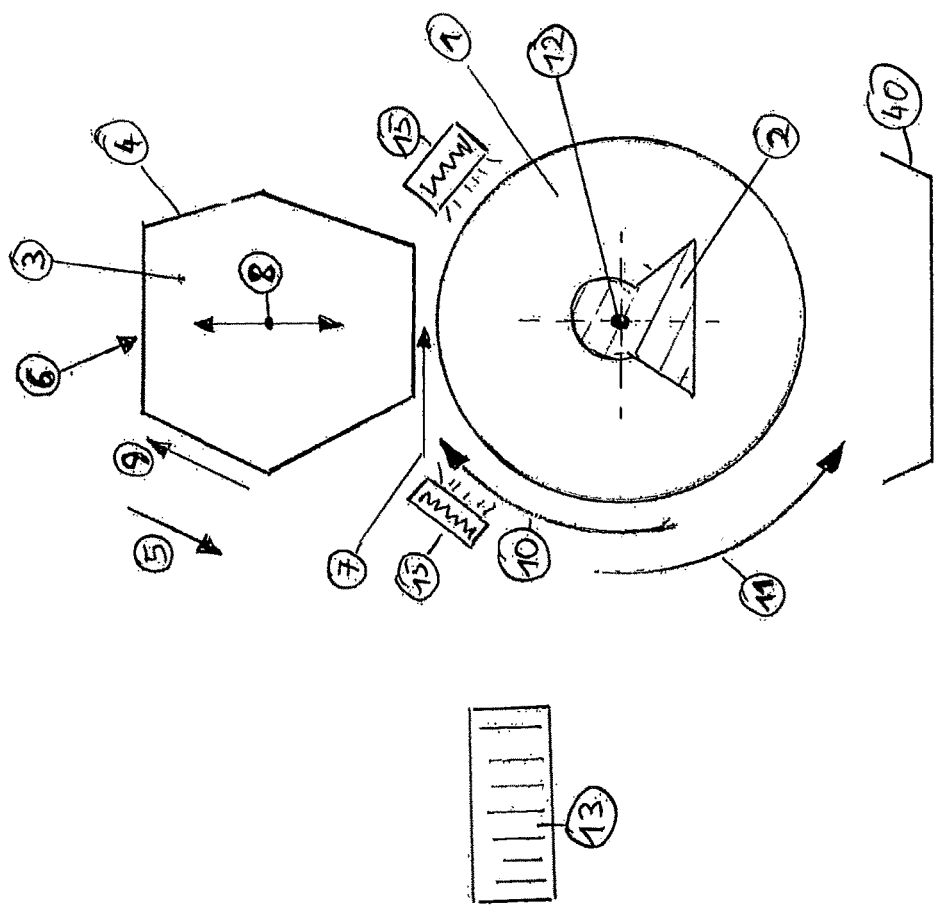

In FIG. 1a, a substrate or object 1 having a curved or cylindrical surface is exchangeably arranged on a carrier element 2. A print head is denoted by reference numeral 3 and comprises a flexible carrier film 4 that is designed as a continuous belt (e.g., an endless belt). In a coating zone 6, the carrier film 4 can be coated with a layer of a photopolymer resin. The carrier film 4 is driven for movement according to arrow 5 or 9 by a first drive mechanism in order to continuously transport a material layer across the exposure field 7 of a light engine (shown in FIG. 2). The light engine is designed for the dynamic patterning of light in the exposure field 7 and induces polymerization of the photopolymer resin layer that is arranged on the carrier film 4 between the carrier film 4 and the curved surface of the substrate 1.

A second drive mechanism is provided for causing movement of the print head 3 relative to the curved surface of the substrate 1 along a displacement path 8 extending perpendicular to a tangent of the curved surface drawn in a theoretical contact point between the curved surface and the material layer on the carrier film 4. In a preferred embodiment (shown in FIG. 1) the print head 3 can move along a vertical axis 8. A first control unit is provided for controlling the circulating velocity of the carrier film 4 to be identical to the circumferential velocity of curved surface of the substrate 1 resulting in that there is no relative movement of the material layer and the curved surface in the exposure field 7 during the relative movement of the curved surface relative to the print head 3. In other words, the carrier film 4 feeds the material layer into the exposure field 7 at the same velocity as the curved surface of the substrate 1 moves along the exposure zone 7. For this purpose, the carrier film 4 circulates according to the arrow 5, if the substrate 1 circulates around its axis according to arrow 10, and the carrier film 4 circulates according to the arrow 9, if the substrate 1 circulates around its axis according to arrow 11. Each complete revolution of the substrate 1 around its axis (either according to arrow 10 or 11) creates a layer of solidified material on the surface of the substrate 1 or the semi-finished work piece printed on top of this surface, wherein after each revolution the print head 3 is elevated in the direction of the arrow 8, in order to allow the creation of solidified layers one over the other. However, in another print mode the print head 3 is elevated continuously during the revolution of the substrate 1 around its axis in such way, that over the period of one revolution of the substrate 1 the target layer thickness of one printed layer is achieved between the carrier film 4 and the actual surface of the substrate 1 or the semi-finished workpiece printed on top of this surface. However, in some embodiments, the substrate 1 may rotate for a while in one direction according to arrow 5 or 9 for printing a new layer or parts of it on the surface of the substrate 1 and then use the respective reverse rotation to print additional layers or parts of it on top of the previous layer or parts of this layer. In such a configuration, the print head 3 can be temporarily elevated more or less than one complete layer thickness to enable various layer thickness and printing mode combinations on the actual surface of the substrate 1 or at parts of this surface or at semi-finished workpieces on top of such surface. In such a configuration, the carrier film 4 circulates accordingly to one of the arrows 5 or 9 to perform the printing process and adequately transport resin into the exposure field 7.

Each layer may be structured according to a defined pattern that is determined by the pattern data fed to the light engine. In order to allow a continuous process, in which the actual surface of the substrate 1 is rotated across the exposure field 7 in a continuous way, e.g., without interrupting the rotation of the curved surface of the substrate 1 across the exposure field 7 over the entire circumference of the curved surface, a pattern data feeder is provided for feeding a data sequence of pattern section data to the light engine for causing the light engine to emit a sequence of pattern sections during the rotation of the substrate 1 relative to the print head 3.

In order to achieve a desired accuracy of the printing process, the feeding rate of the pattern data feeder is synchronized with the circumferential speed of the curved surface of the substrate 1. To this end a rotational encoder unit or bar is provided on a rotation shaft of the substrate 1 or its object carrier 2 that is rotated against a stationary encoder unit 12 so as to sense the position and/or the rotation velocity of the substrate 1 relative to a defined position of the exposure field 7 of print head 3 (e.g. the middle of the exposure field 7). Using this sensor data and knowing the actual diameter of the substrate 1 (respectively including information about the layer thickness of already printed objects or semi-finished workpieces on top of the original surface of the substrate 1) allow for calculating the actual surface velocity of the curved surface to print on. The feeding rate of the pattern data feeder is controlled based on the position and/or (rotational) velocity signal obtained by the rotational encoder 12. Said control process is carried out continuously or at a high frequency in order to achieve synchronization over the entire revolution of the substrate 1.

In a typical embodiment, the print head 3 is centered in such a way above the substrate 1 that the exposure field 7 is centered symmetrically above the rotation axis of the substrate 1 (see FIG. 1b).

In a special embodiment, the print head 3 is located in such a way above the substrate 1 that the gap between the carrier film 4 and the actual surface of the substrate 1, which defines the actual thickness of the printed layer, is closest on one end of the exposure field 7, ideally at the latter end of the exposure pattern (see FIG. 1c). In this case, the exposure pattern in the exposure field 7 is of a two-dimensional manner and the substrate 1 is rotating only according to arrow 10 and the carrier film 4 of the print head 3 is moving according to arrow 5. Alternatively, the substrate 1 is rotating according to arrow 11 and the carrier film 4 of the printhead 3 is moving according to arrow 9 while the latter end of the exposure pattern in the exposure field 7 is now on the other side of the exposure field 7 and the print head 3 might be adjusted adequately to form the closest gap between the carrier film 4 of the print head 3 and the actual surface of the substrate 1 at this place.

The device may comprise a calibrator 13 which might be placed under the exposure field 7 instead of a substrate 1 in order to enable optical measurements of the light engine. Such measurements could be realized in a manual or automatic way. The calibrator 13 may comprise various optical elements, such as camera systems (e.g. in the visible or UV range), photosensors (e.g. for signal timing or positioning control systems or for light or radiation intensity measurements). With such systems also focus plane measurements and potential stitching phenomena could be investigated, e.g., stitching zone phenomena when multiple dynamic light engines are combined to increase the physical extension of the building area of the process or to enable higher amounts of light energy in an exposure field to increase the process throughput.

Further, a residual resin collector 40 may be arranged below the substrate 1 in order to collect superfluous resin.

Heating elements 15 are arranged before and after the exposure field 7 and near the curved surface of the substrate 1, in order to heat parts of the curved surface before and after these parts of the surface travel across the exposure field 7.

Figure 2:
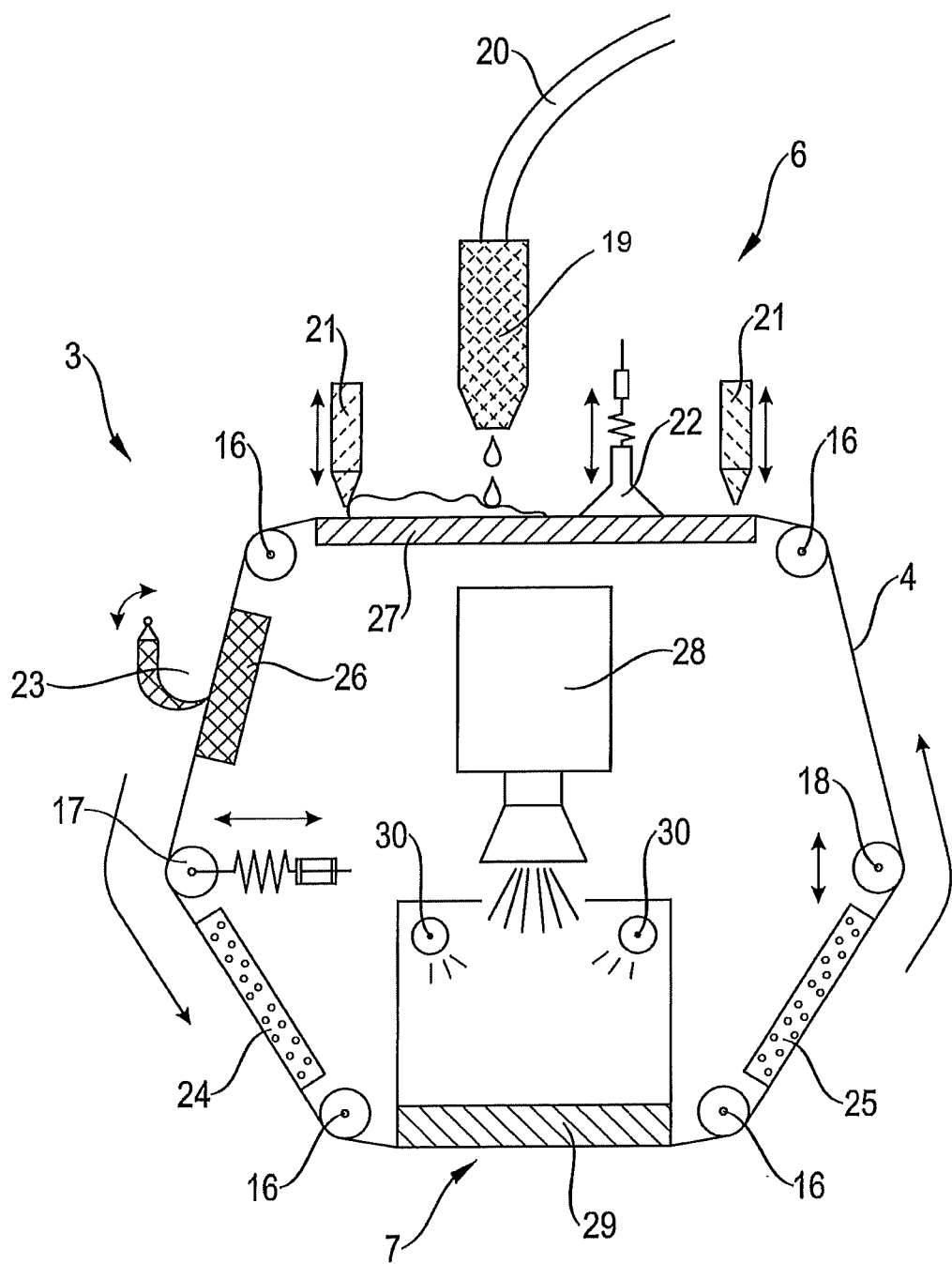
FIG. 2 illustrates a print head for use in the device of FIG. 1.

The print head 3 is shown in greater detail in FIG. 2. The print head 3 comprises an endless carrier film 4 that is guided to circulate along a closed path. The carrier film 4 is guided by a plurality of rollers, including deflection rollers 16, a tension roller 17 and an adjustable roller 18. In the coating zone 6, a nozzle 19 is provided that is connected to a resin feeding hose 20. The nozzle 19 ejects a photopolymer resin onto the carrier film 4. In an embodiment, the resin is ejected as a result of an overpressure (e.g., pressure beyond an acceptable threshold) in the hose 20 and the nozzle 19 when compared to the environment, wherein the overpressure may be created by mechanical or pneumatic systems to pump the viscous photopolymer resin from a storage tank towards the coating zone 6. In some embodiments, such coating mechanisms, including the storage tank, the hose 20 and the nozzle 19, may be heated in a controlled way.

A coating blade 21 serves to define a material layer of a defined thickness on the carrier film 4. The coating blade 21 is adjustable in the height direction in order to adjust the desired layer thickness. Further, a scraper 22 is provided to refresh or mix the material in the coating zone 6. In various embodiments, the scraper 22 may be heated in a controlled way. A support plate 27 is arranged at the back side of the carrier film 4 in the coating zone 6. The support plate 27 may function as a heating element, if needed.

An optional de-coating system denoted by reference numeral 23 may operate to de-coat (e.g., remove material from) the carrier film 4 for various purposes during process cleaning or material exchange procedures. The de-coating system 23 may comprise a scraper blade, which is pressed against a support plate 26 with the moving carrier film 4 being in between.

Heating elements may be provided for keeping or heating the material layer at an elevated temperature, including a pre-heating plate 24 and a post-heating plate 25. Depending on the movement direction of the carrier film 4, the function of said heating plates as being a pre- or post-heating plate may switch. As an example, if the carrier film 4 were rotating in a counter-clockwise direction, the element 24 may operate as a pre-heating plate and the element 25 may operate as a post-heating plate; conversely, if the carrier film 4 were rotating in a clockwise motion, the element 25 may operate a pre-heating plate and the element 24 may operate a post-heating plate.

The light engine 28 of the print head 3 is denoted by the reference numeral 28 and emits light into an exposure field 7. In the exposure field 7 a guiding plate 29 is arranged that is at least partially transparent to the wavelength of the light emitted by the light engine 28. The guiding plate is arranged on the back side of the carrier film 4 and serves to guide the carrier film 4 so as to define a precise position of the carrier film 4 relative to the actual curved surface of the substrate 1 with a precisely defined gap being arranged between the carrier film 4 and at least one point or line across the actual curved surface of the substrate 1. The transparent guiding plate 29 is heated by a contactless heating system comprising infrared lamps 30.

Figure 3:
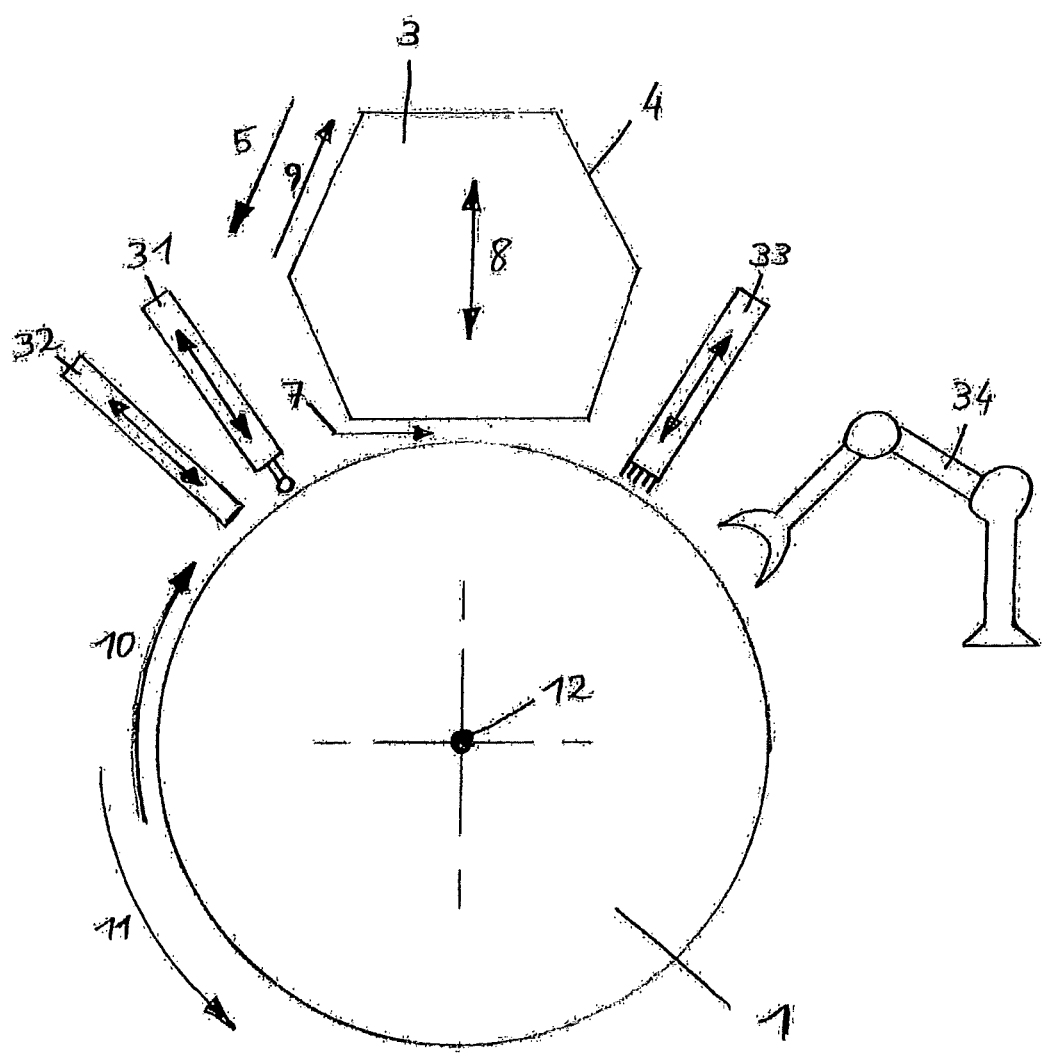
FIG. 3 illustrates a second exemplary embodiment of a printing device of the invention and FIG. 4 illustrates pattern data structured as grid of pixels to be fed to a device of the invention.

In a complementary embodiment according to FIG. 3, one or more material management units (e.g., material structuring and/or material placing and/or material subtracting units) are arranged adjacent or near the print head 3, said material structuring and/or material placing and/or material subtracting units being guided for movement relative to the surface of the substrate 1 along a displacement path extending in a radial direction with respect to the rotation axis of the substrate 1 to adjust their process duties to the varying diameter of the substrate 1 during printing operations.

In some embodiments, the material management units may include a spray coating system 31, an inkjet system 32, a soldering system, a plasma coating system or a wiring system 33 and a multipurpose robotic arm 34. Each of these units may have its own control system using and interpreting data based on position and velocity data of the rotational encoder 12 tracking the position and (rotation) velocity of the rotational substrate 1.

Figure 4:
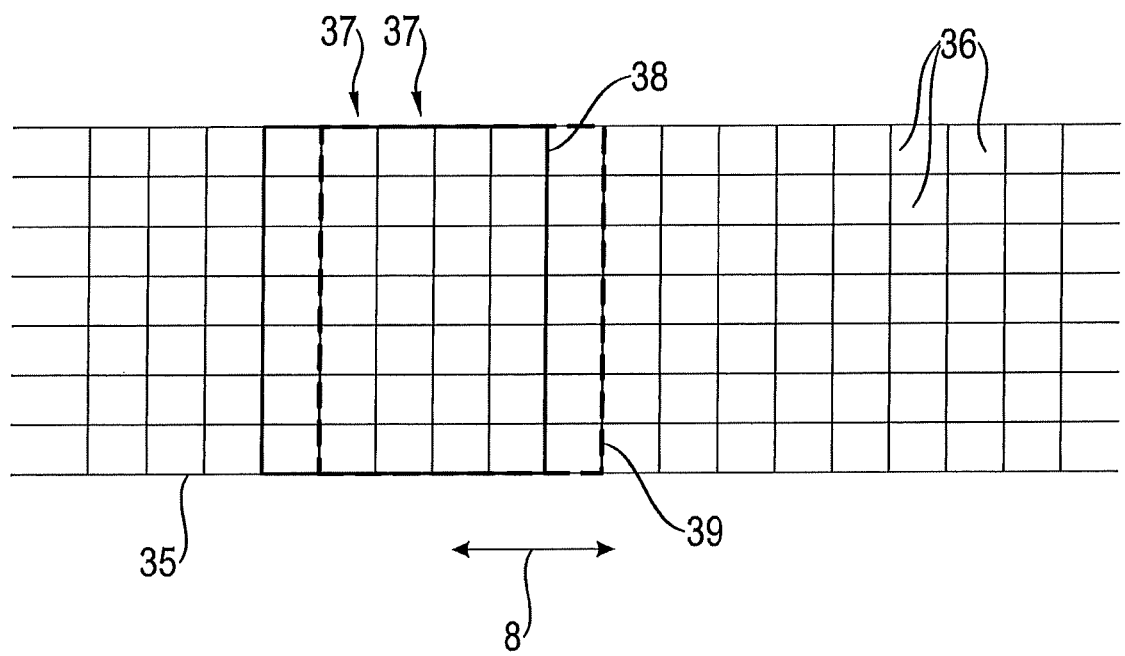

FIG. 4 schematically illustrates the structuring of the pattern data in the form of a virtual grid 35 of pixels 36 that represent the pattern to be printed in a specific layer during the printing process. The length of the pattern along a direction 8 corresponds to the length of the component to be printed. The pattern may be divided into a plurality of pattern sections that may comprise one or more rows 37 of the pattern. For example, a first pattern section is denoted by 38 and comprises five rows 37. A second pattern section is denoted by 39 and is offset by one row 37 relative to the first pattern section 38. The same applies to further pattern sections that are each offset by one row of pixels. As the actual surface of the substrate 1 continuously moves relative to the exposure field 7, the sequence of pattern sections 38, 39, etc. is fed to the light engine 28, in order to adapt the pattern to the current angular position of the actual surface of the substrate 1. According to the invention, the feed rate of the sequence of pattern section is adapted to the circumferential velocity of the actual surface of the substrate 1 as calculated based on data sensed by the rotational encoder 12, in order to safeguard a precise printing process.

The printing process can be physically scaled in terms of the maximum length of substrates extending along their rotation axis by selecting a suitable width of the exposure field, e.g., the width of the light engine (such as the length of the laser scanning line or the length of the LED or micro LED array) or by using a plurality of light engines side by side. The process can be further scaled in terms of the maximum diameter of substrates as the movement length of the print head 3 along its displacement path 8 can be easily adapted to actual process requirements. The process can also be scaled in terms of throughput or exposure speed, since the accuracy of the printing process is independent of the relative velocity of the actual surface of the substrate 1 and exposure field 7 due to the position and/or velocity measuring system that controls the feeding rate of the pattern data feeder. Although there are photochemical restraints to maximum printing velocities, these limitations are strongly material dependent and thus could vary significantly for different photosensitive substances and also for different printing conditions, such as printing temperature and atmospheric conditions (e.g. process gases).

Figure 5A:
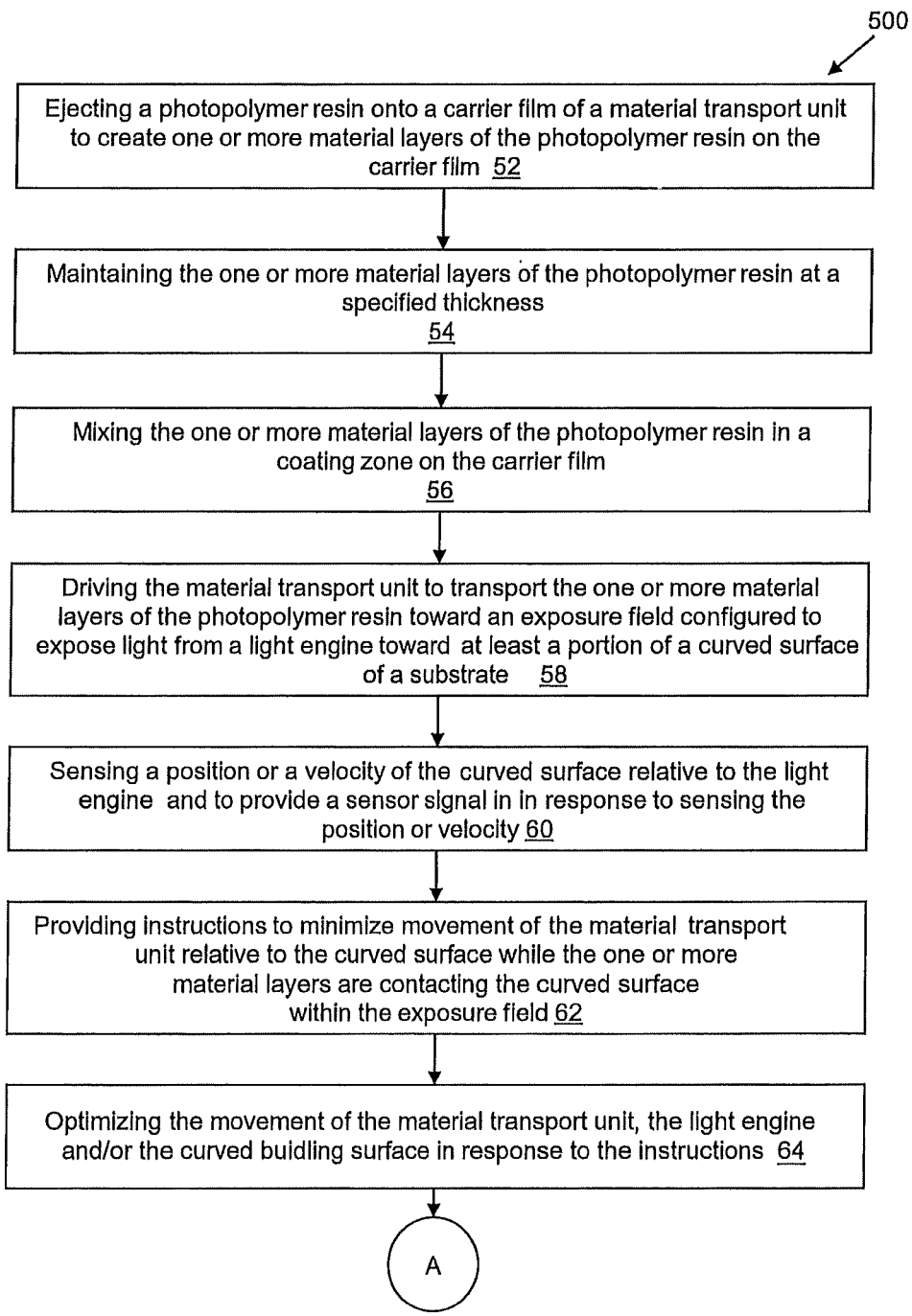
FIGS. 5A and 5B illustrate a flowchart of an example method for 3D printing an object using a 3D printing system.
Figure 5B:
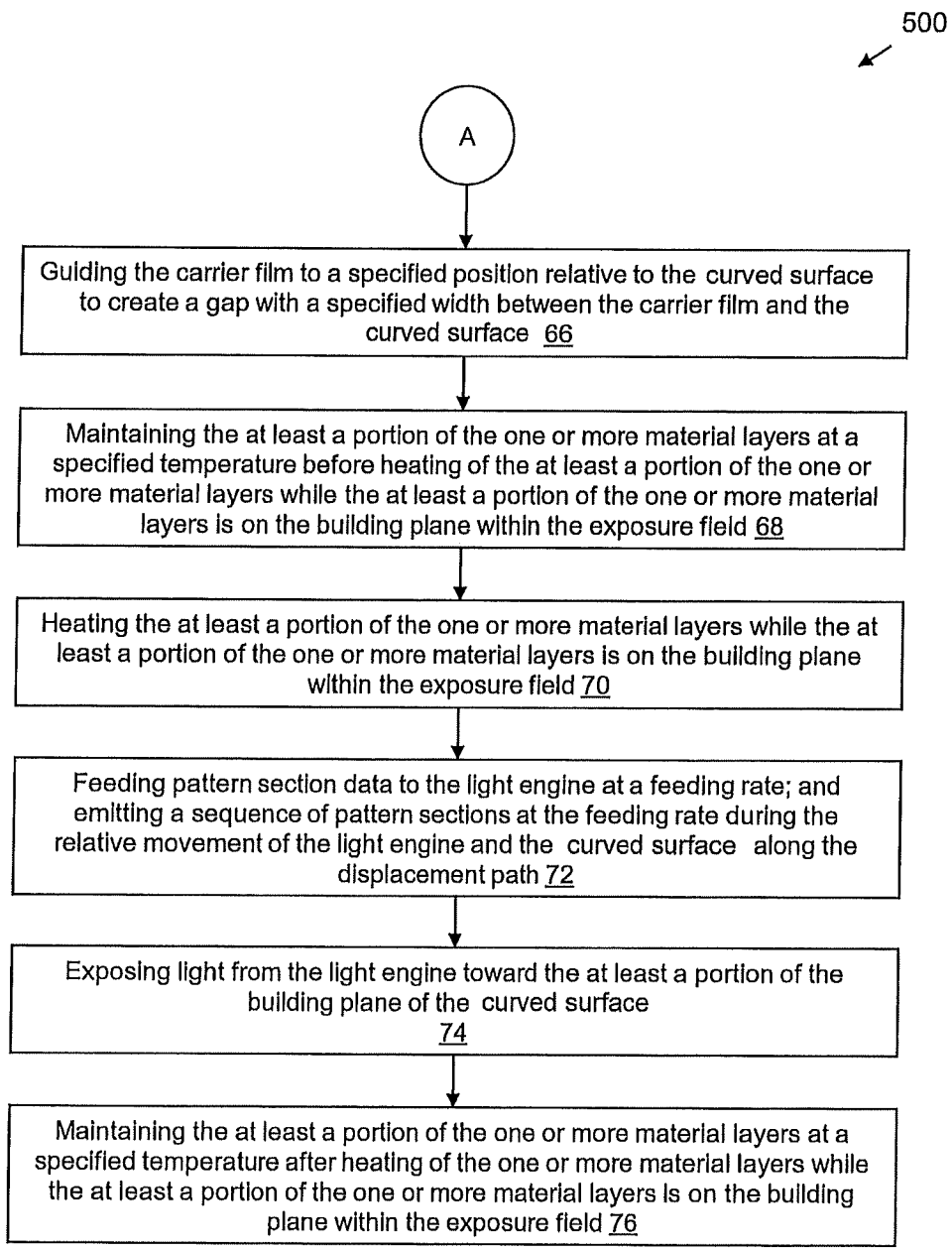

FIGS. 5A and 5B a flowchart 500 of an example method for 3D printing an object using a 3D printing system. The flowchart 500 is discussed in conjunction with the example structures described in the context of FIGS. 1-4. It is noted, however, that the operations of the flowchart 500 may be executed by structures and/or devices other than those shown in FIGS. 1-4. The operations of the flowchart 500 are by way of example only, and it is noted that various implementations may employ a greater or lesser number of operations than those shown in FIGS. 5A and 5B.

At an operation 52, a photopolymer resin may be ejected onto a carrier film of a material transport unit to create one or more material layers of the photopolymer resin on the carrier film. In some embodiments, the nozzle 19 may eject photopolymer resin onto the coating zone 6 on the carrier film 4. As noted herein, this may occur on a surface of the carrier film 4 adjacent to the support plate 27 and/or other convenient surfaces of the carrier film.

At an operation 54, the thickness of the one or more material layers may be maintained at a specified thickness. In some embodiments, maintaining the thickness of the one or more material layers could involve removing at least a part of those material layers to level them. Referring to FIG. 2, the coating blade 21, for instance, may operate to maintain the material layers at a desired thickness, e.g., by removing and/or leveling the material layers.

At an operation 56, the one or more material layers may be mixed in a coating zone on the carrier film. Referring to FIG. 2, the scraper 22, for instance, may operate to mix material layers on the coating zone 6 of the carrier film 4.

At an operation 58, the material transport unit may be driven to transport the one or more material layers toward an exposure field that is configured to expose light from a light source toward at least a portion of a curved surface of a substrate. Referring again to FIG. 2, the carrier film 4 may be driven by a first drive mechanism, depending on embodiment, along the arrow 5 or the arrow 9 to transport the one or more material layers deposited on the coating zone 6 toward a contact zone of the curved surface and/or toward the exposure field 7 associated with the light engine 28. As noted herein, other drive mechanisms may be used to drive the material layers toward an exposure field and/or a building plane as well.

At an operation 60, a position or velocity of the curved surface may be sensed relative to the light engine. A sensor signal may be provided in response to the sensing of the position or velocity of the curved surface. Referring to FIG. 1 and FIG. 2, the rotational encoder 12 may operate to sense position/(circumferential) velocity of the curved surface relative to the light engine 28. As noted herein, the rotational encoder 12 may provide sensor signals to control units, which may reside internally and/or be coupled to the rotational encoder 12. The rotational encoder 12 may be configured to sense optical marks, electromagnetic marks and/or magnetic marks. As noted herein, a control unit may adjust feeding rates of a pattern data feeder in response to the sensor signal.

At an operation 62, instructions to optimize movement of the material transport unit relative to the curved surface while the one or more material layers are contacting the curved plane within the exposure field may be provided. A control unit (possibly external to or residing within the rotational encoder 12) may be configured to provide instructions to optimize movement of the carrier film 4, the substrate 1 or some combination thereof to optimize their movement relative to one another. In some embodiments, this may involve minimizing relative movement and/or synchronizing their movement so that the carrier film 4, the light engine 28, and/or the actual curved building surface are synchronized in position and/or velocity.

At an operation 64, the movement of the material transport unit, the light engine, and/or the curved building surface may be optimized in response to the instructions. For instance, the movement of the carrier film 4 and the substrate 1 may be optimized (e.g., minimized, etc.) so that the carrier film 4, the light engine 28, and/or the curved building surface are synchronized in position and/or velocity. As noted herein, the tension roller 17 and/or the adjustable roller 18 may operate, in response to the instructions, to modify positions/velocities of the carrier film. In some embodiments, the motion of the tension roller 17 and/or the adjustable roller 18 is synchronized with the circumferential velocity of the curved surface of the substrate 1 to optimize movement between the carrier film 4 relative to the curved building surface.

At an operation 66, the carrier film may be guided to a specified position relative to the curved surface of the substrate 1 to create a gap with a specified width between the carrier film and the curved surface. For instance, the carrier film 4 may be guided to a specified position relative to the curved surface to create a gap with a specified width between the carrier film 4 and the curved surface. This gap may allow for 3D printing and/or selective curing (described in detail herein) between the carrier film 4 and the curved surface.

At an operation 68, the one or more material layers may be maintained at a specified temperature, e.g. by being heated within the exposure field. As an example, the pre-heating plate 24 if the carrier film 4 is moving along arrow 5 (or alternatively the element 25 if the carrier film is moving along arrow 9) may operate to heat the material layers before they are heated by the contactless heating system(s) 30 within the exposure field 7.

At an operation 70, at least a portion of the material layers may be heated while on the building plane within the exposure field 7. In some embodiments, the contactless heating system 30 may heat the material layers while they reside on the curved surface within the exposure field 7.

At an operation 72, pattern section data may be fed to the light engine at a feeding rate. A sequence of pattern sections may be emitted at the feeding rate during the relative movement of the light engine and the curved surface of the substrate 1 along the displacement path. In some embodiments, a pattern data feeder may feed pattern section data to the light engine 28 at a feeding rate. As noted herein, the feeding rate may be controlled by a control unit coupled to or internal to the rotational encoder 12. This may occur along a displacement path (e.g. based on calculations of rotation of the substrate 1 measured by rotational encoder 12 and/or displacement path 8) or other path.

At an operation 74, light from the light engine may be exposed to at least a portion of the building plane of the curved surface. In some embodiments, the light engine 28 may operate to expose light (e.g., through the guiding plate 29) toward the curved surface. Advantageously, due to positioning and/or heating of the material layers, such light from the light engine 28 may operate to 3D print materials, even those with formulations with viscosities that were traditionally difficult to 3D print.

At an operation 76, the at least a portion of the material layers may be maintained at a specified temperature (possibly, but not necessarily the same as the specified temperature maintained before photo curing) after they are heated and/or cured. As noted herein, depending on direction the post-heating plate 25 or the element 24 may perform this operation.

The invention claimed is:

1. A device for lithography-based additive manufacturing of three-dimensional structures on a substrate, comprising:
a carrier element for carrying the substrate, the substrate having a curved surface;
a light engine designed for dynamic patterning of light in an exposure field of said light engine;
a material transport unit comprising first drive means for transporting a material layer across the exposure field while the material layer is contacting the curved surface;
second drive means for causing rotational movement of the substrate having the curved surface to establish a rolling contact of the curved surface on the material layer in a contact zone, said contact zone being arranged in the exposure field;
first control means configured to control said first and/or second drive means so that said rolling contact of the curved surface on the material layer is essentially slip-free
the light engine being adapted to emit light during said rolling contact of the curved surface on the material layer, thereby selectively curing the material layer in the contact zone.

2. The device according to claim 1, further comprising
pattern data feeding means for feeding a sequence of pattern section data to the light engine at an adjustable feeding rate for causing the light engine to emit a sequence of pattern sections at said feeding rate during said rolling contact of the curved surface on the material layer;
an encoder for sensing a rotational position and/or a circumferential velocity of the curved surface relative to the light engine; and
second control means for adjusting the feeding rate of the pattern data feeding means based on the rotational position or the circumferential velocity sensed by the encoder.

3. The device according to claim 2, wherein the light engine is designed for intermittently emitting light to said exposure field at an adjustable light pulse rate.

4. The device according to claim 3, wherein the light engine is configured to synchronize the light pulse rate to the feeding rate of the pattern data feeding means.

5. The device according to claim 3, wherein the light engine is configured to adjust a pulse-duty factor of the light pulses, wherein the pulse-duty factor is set to 0.1 to 0.8.

6. The device according to claim 2, wherein the pattern data feeding means comprise a data storage that stores pattern data representative of a pattern of a material layer to be built on the curved surface, said pattern data being associated with a length dimension of said pattern measured in a circumferential direction of the rotation caused by the second drive means, wherein said pattern data comprises pattern section data representative of a plurality of pattern sections of said pattern along the length dimension of said pattern.

7. The device according to claim 6, wherein the pattern data is structured as a rectangular grid of pixels comprising a plurality of rows of pixels, wherein each pattern section comprises at least one row of pixels.

8. The device according to claim 7, wherein said sequence of pattern section data fed to the light engine represent pattern sections that are offset from each other by one row of pixels.

9. The device according to claim 1, wherein the material transport unit comprises a flexible carrier film that is at least partially transparent to the light emitted by the light engine, and wherein coating means are arranged for coating a front side of the flexible carrier film with the material layer, the front side of the carrier film facing the curved surface of the substrate when moving across the exposure field.

10. The device according to claim 9, wherein a guiding plate is arranged in the exposure field between the light engine and the carrier film to define a gap between the carrier film and the curved surface and wherein the guiding plate is at least partially transparent to the light emitted by the light engine.

11. The device according to claim 10, wherein the guiding plate is adjustable in a direction perpendicular to the curved surface in the contact zone.

12. The device according to claim 10, wherein first heating means are provided for heating the guiding plate.

13. The device according to claim 12, wherein second heating means are arranged between the coating means and the exposure field for heating the material layer.

14. The device according to claim 1, wherein third drive means are provided for causing relative movement of the material transport unit and the curved surface along a displacement path extending perpendicular to the curved surface.

15. The device according to claim 1, wherein at least one secondary material structuring unit and/or material placing unit and/or material subtracting unit is arranged adjacent a unit comprising the light engine and the material transport unit, said material structuring unit and/or material placing unit and/or material subtracting unit being guided for relative movement to the curved surface along a displacement path extending in a circumferential direction of the rotation caused by the second drive means and/or perpendicular thereto.

16. A method for lithography-based additive manufacturing of three-dimensional structures on a substrate, the method comprising:
ejecting a photopolymer resin onto a carrier film of a material transport unit to create at least one material layer of the photopolymer resin on the carrier film;
driving the material transport unit to transport the at least one material layer of the photopolymer resin across an exposure field configured to expose light from a light engine toward a curved surface of the substrate while the material layer is contacting the curved surface;
causing the curved surface to rotate to establish a rolling contact of the curved surface on the at least one material layer in a contact zone, while transporting the at least one material layer across the exposure field,
the light engine emitting light during said rolling contact of the curved surface on the at least one material layer, thereby selectively curing the at least one material layer in the contact zone.

17. The method of claim 16, wherein the curved surface is a cylindrical surface.

18. The method of claim 16, wherein a circumferential velocity of the curved surface and a transport velocity of the at least one material layer across the exposure field are adjusted to one another so that said rolling contact of the curved surface on the at least one material layer is essentially slip-free.

19. The method of claim 16, further comprising:
feeding a sequence of pattern section data to the light engine;
the light engine emitting a sequence of pattern sections at an adjustable feeding rate during said rolling contact of the curved surface on the at least one material layer, thereby selectively curing the at least one material layer in the contact zone according to the sequence of pattern sections;

sensing a rotational position or a circumferential velocity of the curved surface relative to the light engine and providing a sensor signal in response to sensing the rotational position or the circumferential velocity;

adjusting the feeding rate in response to the sensor signal.

20. The method of claim 19, further comprising intermittently exposing light from the light engine toward the contact zone at an adjustable light pulse rate.

21. The method of claim 20, further comprising synchronizing the light pulse rate to the feeding rate of the sequence of pattern sections.

22. The method of claim 20, further comprising adjusting a pulse-duty factor of light pulses, wherein the pulse-duty factor is set to 0.1 to 0.8.

23. The method of claim 16, wherein driving the material transport unit to transport the at least one material layer of the photopolymer resin toward the exposure field comprises rotating the carrier film toward the exposure field.

24. The method of claim 16, further comprising heating a portion of the at least one material layer while said portion of the at least one material layer is in the contact zone within the exposure field.

25. The method of claim 24, further comprising maintaining, with a pre-heating plate, the portion of the at least one material layer at a specified temperature before transporting the portion of the at least one material layer toward the exposure field.

26. The method of claim 24, further comprising maintaining, with a post-heating plate, the portion of the at least one material layer at a specified temperature after transporting the portion of the at least one material layer away from the exposure field.

27. The method of claim 16, further comprising guiding the carrier film to a specified position relative to the curved surface to create a gap with a specified width between the carrier film and the curved surface.

28. The method of claim 16, further comprising maintaining the at least one material layer of the photopolymer resin at a specified thickness.

29. The method of claim 16, further comprising mixing the at least one material layer of the photopolymer resin in a coating zone on the carrier film.

30. The method of claim 16, further comprising performing structuring, placement, subtraction, or a combination thereof, to the at least one material layer.

31. The method of claim 16, further comprising heating with one or more contactless heating lamps a portion of the at least one material layer while the portion of the at least one material layer is in the contact zone within the exposure field.

* * * * *